(12) United States Patent
Lim et al.

(10) Patent No.: US 10,840,212 B2
(45) Date of Patent: Nov. 17, 2020

(54) BONDING PACKAGE COMPONENTS THROUGH PLATING

(71) Applicant: Taiwan Semiconductor Manufacturing Company, Ltd., Hsinchu (TW)

(72) Inventors: Zheng-Yi Lim, Hsinchu (TW); Yi-Wen Wu, Xizhi (TW); Tzong-Hann Yang, Taipei (TW); Ming-Che Ho, Tainan (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/580,666

(22) Filed: Sep. 24, 2019

(65) Prior Publication Data
US 2020/0020662 A1 Jan. 16, 2020

Related U.S. Application Data

(60) Continuation of application No. 15/632,686, filed on Jun. 26, 2017, now Pat. No. 10,483,230, which is a
(Continued)

(51) Int. Cl.
*H01L 23/00* (2006.01)
*H01L 23/498* (2006.01)
(Continued)

(52) U.S. Cl.
CPC ............. *H01L 24/81* (2013.01); *H01L 21/56* (2013.01); *H01L 23/3107* (2013.01); *H01L 23/3128* (2013.01); *H01L 23/49* (2013.01); *H01L 23/49816* (2013.01); *H01L 23/49833* (2013.01); *H01L 24/13* (2013.01); *H01L 24/16* (2013.01); *H01L 24/17* (2013.01); *H01L 25/0657* (2013.01); *H01L 25/105* (2013.01); *H01L 25/50* (2013.01); *H01L 23/49811* (2013.01); *H01L 24/05* (2013.01); *H01L 2224/0401* (2013.01); *H01L 2224/13016* (2013.01); *H01L 2224/13017* (2013.01); *H01L 2224/13018* (2013.01); *H01L 2224/13023* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01);
(Continued)

(58) Field of Classification Search
CPC . H01L 2224/32135; H01L 2224/32141; H01L 2224/32145; H01L 2224/32148; H01L 23/49; H01L 24/81
USPC .......................... 438/107–109, 118, 119, 678
See application file for complete search history.

(56) References Cited

U.S. PATENT DOCUMENTS 5,290,423 A * 3/1994 Helber, Jr. ................ H05K 3/32
205/114
7,807,572 B2 * 10/2010 Mathew ................... H01L 24/11
257/E21.175
(Continued)

*Primary Examiner* — Matthew E Warren
(74) *Attorney, Agent, or Firm* — Slater Matsil, LLP

(57) ABSTRACT

A method includes aligning a first electrical connector of a first package component to a second electrical connector of a second package component. With the first electrical connector aligned to the second electrical connector, a metal layer is plated on the first and the second electrical connectors. The metal layer bonds the first electrical connector to the second electrical connector.

20 Claims, 11 Drawing Sheets

Related U.S. Application Data continuation of application No. 14/833,840, filed on Aug. 24, 2015, now Pat. No. 9,691,738, which is a division of application No. 13/527,422, filed on Jun. 19, 2012, now Pat. No. 9,117,772.

(51) Int. Cl.

| | | |
|---|---|---|
| *H01L 23/49* | (2006.01) | |
| *H01L 25/10* | (2006.01) | |
| *H01L 25/00* | (2006.01) | |
| *H01L 21/56* | (2006.01) | |
| *H01L 23/31* | (2006.01) | |
| *H01L 25/065* | (2006.01) | |

(52) U.S. Cl.
CPC ............ *H01L 2224/13582* (2013.01); *H01L 2224/13583* (2013.01); *H01L 2224/13611* (2013.01); *H01L 2224/13644* (2013.01); *H01L 2224/13647* (2013.01); *H01L 2224/13655* (2013.01); *H01L 2224/13657* (2013.01); *H01L 2224/13664* (2013.01); *H01L 2224/16148* (2013.01); *H01L 2224/16225* (2013.01); *H01L 2224/16238* (2013.01); *H01L 2224/16501* (2013.01); *H01L 2224/16505* (2013.01); *H01L 2224/32135* (2013.01); *H01L 2224/32141* (2013.01); *H01L 2224/32145* (2013.01); *H01L 2224/32148* (2013.01); *H01L 2224/811* (2013.01); *H01L 2224/8112* (2013.01); *H01L 2224/81085* (2013.01); *H01L 2224/8192* (2013.01); *H01L 2224/81121* (2013.01); *H01L 2224/81193* (2013.01); *H01L 2224/81232* (2013.01); *H01L 2224/81355* (2013.01); *H01L 2224/81359* (2013.01); *H01L 2224/81801* (2013.01); *H01L 2225/0652* (2013.01); *H01L 2225/06513* (2013.01); *H01L 2225/06517* (2013.01); *H01L 2225/1023* (2013.01); *H01L 2225/1058* (2013.01); *H01L 2924/0105* (2013.01); *H01L 2924/01027* (2013.01); *H01L 2924/01028* (2013.01); *H01L 2924/01029* (2013.01); *H01L 2924/01046* (2013.01); *H01L 2924/01047* (2013.01); *H01L 2924/01079* (2013.01); *H01L 2924/1533* (2013.01); *H01L 2924/15311* (2013.01); *H01L 2924/15331* (2013.01); *H01L 2924/181* (2013.01); *H01L 2924/1815* (2013.01); *H01L 2924/18161* (2013.01); *H01L 2924/3841* (2013.01)

(56) References Cited

U.S. PATENT DOCUMENTS

| | | | |
|---|---|---|---|
| 8,558,379 | B2 | 10/2013 | Kwon |
| 2007/0262468 | A1* | 11/2007 | Nasu ................. H01L 23/48 257/778 |
| 2009/0014897 | A1 | 1/2009 | Ohno |
| 2010/0038777 | A1* | 2/2010 | Farooq ............... H01L 24/11 257/737 |
| 2012/0025365 | A1* | 2/2012 | Haba .................. H01L 21/4853 257/692 |
| 2012/0061814 | A1 | 3/2012 | Camacho et al. |
| 2012/0080787 | A1 | 4/2012 | Shah et al. |
| 2012/0211885 | A1 | 8/2012 | Choi et al. |
| 2012/0326297 | A1 | 12/2012 | Choi et al. |
| 2013/0334692 | A1 | 12/2013 | Lim et al. |

* cited by examiner

BONDING PACKAGE COMPONENTS THROUGH PLATING

PRIORITY CLAIM AND CROSS-REFERENCE

This application is a continuation of U.S. patent application Ser. No. 15/632,686, entitled "Bonding Package components Through Plating," filed on Jun. 26, 2017, which is a continuation of U.S. patent application Ser. No. 14/833,840, entitled "Bonding Package components Through Plating," filed on Aug. 24, 2015, now U.S. Pat. No. 9,691,738 issued Jun. 27, 2017, which application is a divisional of U.S. patent application Ser. No. 13/527,422, entitled "Bonding Package components Through Plating," filed on Jun. 19, 2012, now U.S. Pat. No. 9,117,772 issued Aug. 25, 2015, which applications are incorporated herein by reference.

BACKGROUND

In the formation of a semiconductor wafer, integrated circuit devices such as transistors are first formed at the surface of a semiconductor substrate. Interconnect structures are then formed over the semiconductor substrate and the integrated circuit devices. Electrical connectors such as metal bumps are formed on the surface of the semiconductor wafer to electrically connect to the integrated circuit devices. The semiconductor wafer is sawed into a plurality of semiconductor chips.

Packaging the semiconductor chips may be performed through reflow processes. During the reflow processes, the solder regions between the electrical connectors of the semiconductor chips are reflowed to bond the semiconductor chips to other package components such as device dies, interposers, package substrates, or the like. The solder regions are molten in the reflow processes. The shapes and the profiles of the molten solder regions are difficult to control, however. This may cause problems such as bridging, and hence deteriorations of the bonding quality or the yield loss.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package and the method of forming the same are provided in accordance with various exemplary embodiments. Intermediate stages of forming the package through a bonding process are illustrated. Variations of the embodiments are discussed. Throughout various views and illustrative embodiments, like reference numbers are used to designate like elements.

Figure 1:
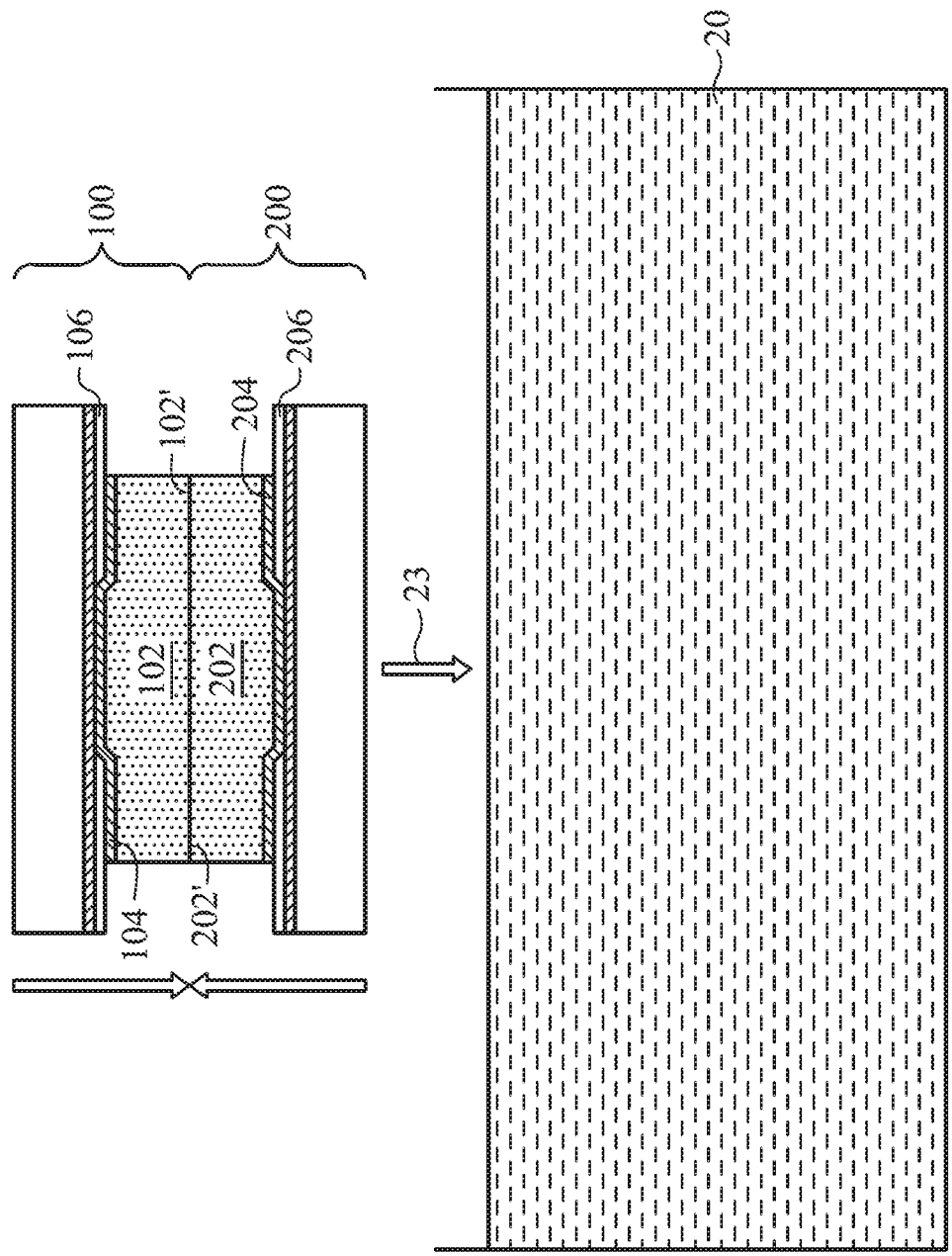
FIGS. 1 through 6 are cross-sectional views of intermediate stages in the bonding of package components in accordance with some exemplary embodiments, wherein the bonding is performed through the plating of metal layers.

FIG. 1 illustrates package components 100 and 200 that are to be bonded to each other. Each of package components 100 and 200 may be a device die, an interposer die, a package substrate (such as a laminate substrate), a package, or the like. When package component 100 or 200 is a device die, it may be a memory die, a core device die, or the like, which includes active devices (not shown) such as transistors therein. When package component 100 or 200 is an interposer die, the interposer die is free from active devices therein, and may or may not comprise passive devices (not shown) such as resistors and capacitors therein. Package component 100 includes electrical connector 102, and package component 200 includes electrical connector 202. Electrical connectors 102 and 202 may be metal connectors comprising copper, nickel, palladium, aluminum, gold, alloys thereof, and combinations thereof. Accordingly, electrical connectors 102 and 202 are alternatively referred to hereinafter as metal connectors 102 and 202, respectively.

Figure 2:
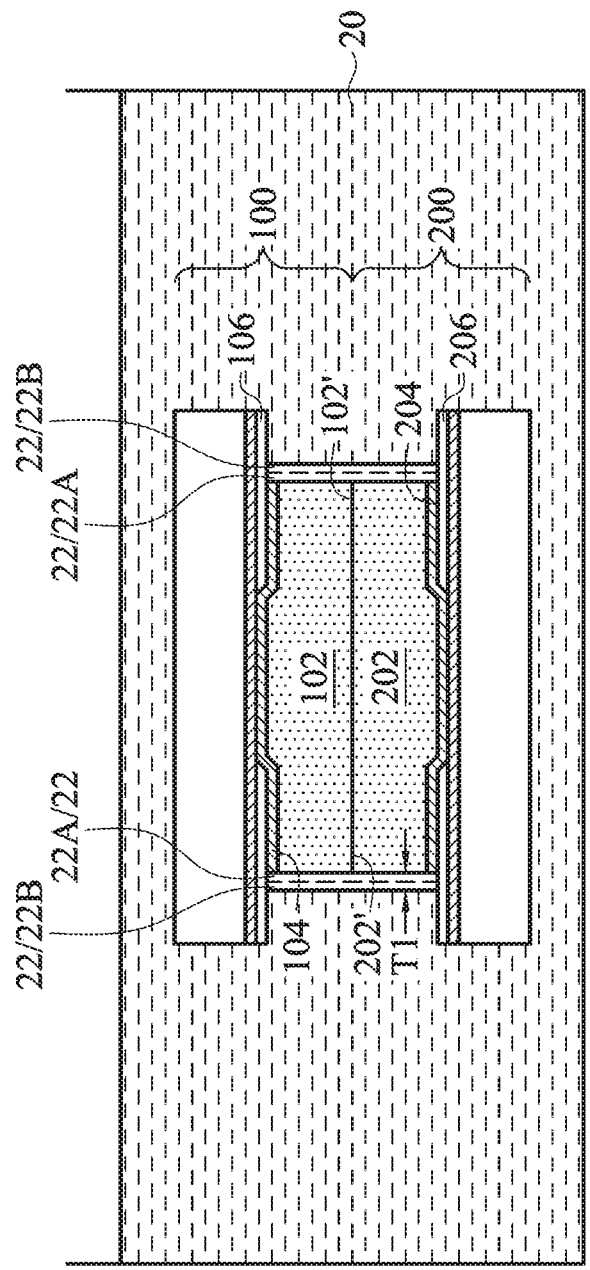

In some embodiments, connectors 102 and 202 are metal pillars. In these embodiments, connector 102 is formed on Under-Bump Metallurgy (UBM) 104, which is connected to a metal pad (not shown). Similarly, connector 202 is formed on UBM 204, which is connected to a metal pad (not shown). In alternative embodiments, one of connectors 102 and 202 is a metal pad that is similar to metal pads 102A shown in FIG. 5. As also shown in FIG. 1, package components 100 and 200 are placed against each other, with electrical connectors 102 and 202 aligned to each other, and placed in contact with each other. Surface 102' of connector 102 is in contact with surface 202' of connector 202. Surfaces 102' and 202' are substantially flat to have a good contact. Package components 100 and 200 are held together as an integrated unit, for example, using a clamp (not shown). Reaction solution 20 is provided for performing the subsequent process step as shown in FIG. 2. Arrows 21 represent that package components 100 and 200 are placed against each other, and arrow 23 represents that package components 100 and 200 are placed into reaction solution 20.

Next, referring to FIG. 2, package components 100 and 200 are submerged into reaction solution 20. During and after the step of submerging package components 100 and 200, the relative positions of connectors 102 and 202 are fixed, and connectors 102 and 202 do not move relative to each other. Connectors 102 and 202 remain in contact with each other for a period of time when package components 100 and 200 are in reaction solution 20.

Reaction solution 20 is configured to react with electrical connectors 102 and 202, so that metal plated layer 22 (including layer 22A and layer 22B, which are referred to collectively as 22) is plated on the surfaces of electrical connectors 102 and 202. The reaction may be an electroless plating reaction or an immersion reaction, and is selective, so that metal layer 22 is plated on electrical connectors 102 and 202, and not on the dielectric layers such as 106 and 206 in package components 100 and 200, respectively. In some embodiments, during the reaction, the metal ions in reaction solution 20 are deposited on the surfaces of electrical connectors 102 and 202 to form metal layer 22. The corresponding reaction is referred to as the electroless plating reaction. In alternative embodiments, during the reaction, the metal ions in reaction solution 20 replaces the metal atoms in the surface layer of electrical connectors 102 and 202 to form metal layer 22. The corresponding reaction is referred to as the immersion reaction. The resulting metal layer 22 comprises a material selected from electroless copper, electroless Cobalt (CoB or CoWP), Electroless Nickel (EN), Electroless Nickel Immersion Gold (ENIG), Electroless Nickel Electroless Palladium (ENEP), Electroless Nickel Electroless Palladium Immersion Gold (ENEPIG), Immersion Tin (ImSn), Immersion Silver (ImAg), Immersion Gold (ImAu), and combinations thereof. During the plating, reaction solution 20 may be heated to a temperature between about 25° C. and about 90° C.

When metal layers 22 are each a composite layer such as ENIG, ENEP, ENEPIG, or the like, package components 100 and 200 may be placed in a plurality of immersion reaction solutions sequentially, so that a plurality of layers are formed layer by layer. For example, when metal layer 22 is an ENIG layer, package components 100 and 200 are placed into a first reaction solution to plate a nickel layer. Package components 100 and 200 are then placed into a second reaction solution to plate a gold layer. During and between the first and the second immersion reactions, the positions of electrical connectors 102 and 202 do not shift relative to each other.

As a result of the plating of metal layer 22, electrical connectors 102 and 202 are bonded to each other, and hence package components 100 and 200 are also bonded together. Thickness T1 of metal layer 22 may be between about 0.2 µm and about 20 µm, and is great enough so that metal layer 22 is strong enough to bond electrical connectors 102 and 202 together, and metal layer 22 does not break. It is appreciated that the dimensions recited throughout the description are merely examples, and may be changed to different values. Depending on the process of the electroless plating or the immersion reaction, metal layer 22 may include a single layer such as nickel, copper, cobalt, silver, tin, gold, or the like. Metal layer 22 may also be a composite layer including a plurality of sub-layers selected from nickel, palladium, gold, copper, cobalt, silver, tin, and the like. Each of the sub-layers may form a ring that encircles electrical connectors 102 and 202, and the outer rings encircle inner rings. For example, when metal layer 22 is an ENIG layer, a gold layer encircles a nickel layer. Furthermore, metal layer 22 includes first portions on the sidewalls of electrical connector 102 and the second portions on the sidewalls of electrical connector 202. No distinguishable interface exists between the first portions and the second portions since the first and the second portions of metal layer 22 are formed simultaneously. The first portions and the second portions may have substantially uniform thicknesses. After plating, package components 100 and 200 are removed from reaction solution 20, and are rinsed, for example, using de-ionized water.

Figure 3:
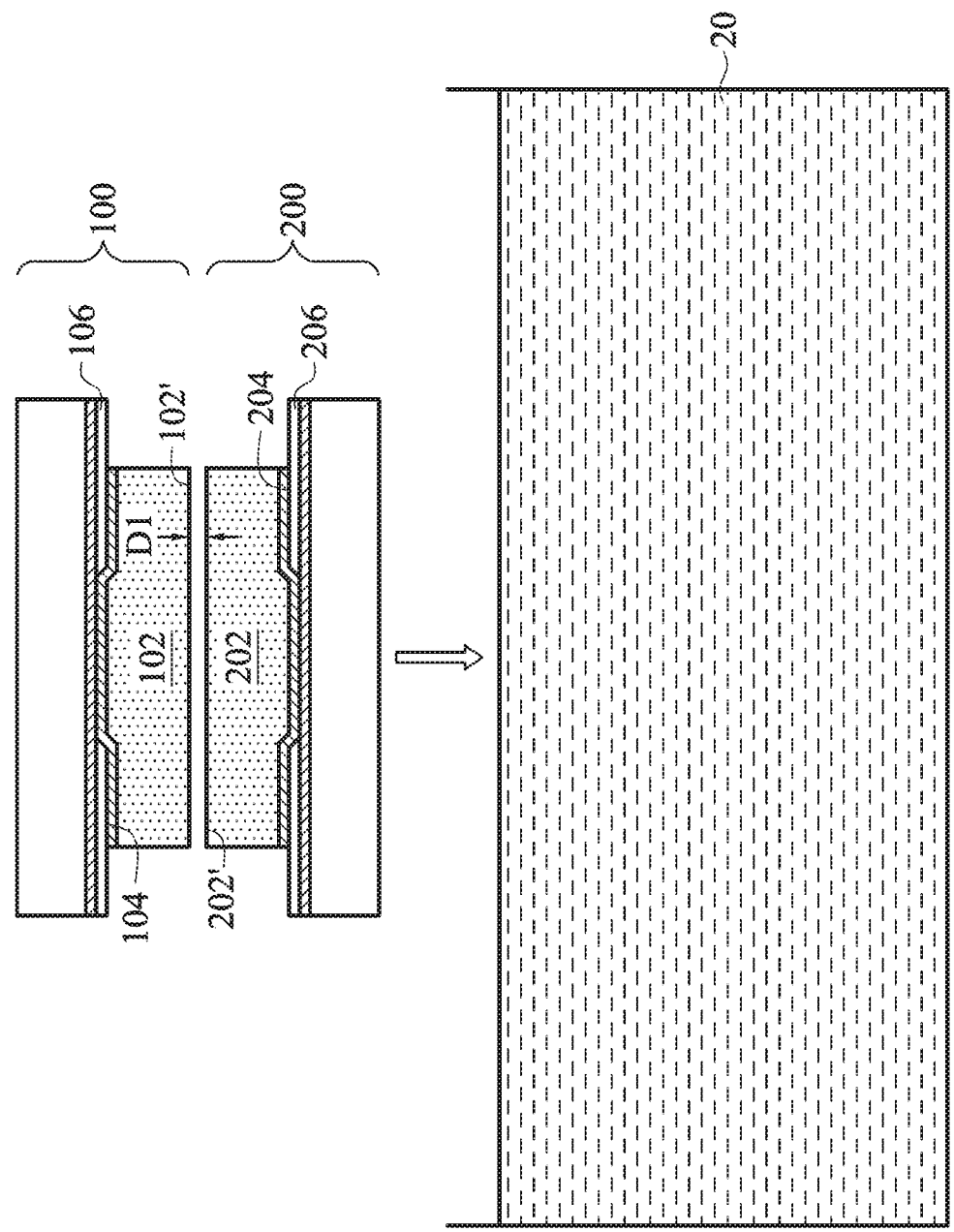
Figure 4:
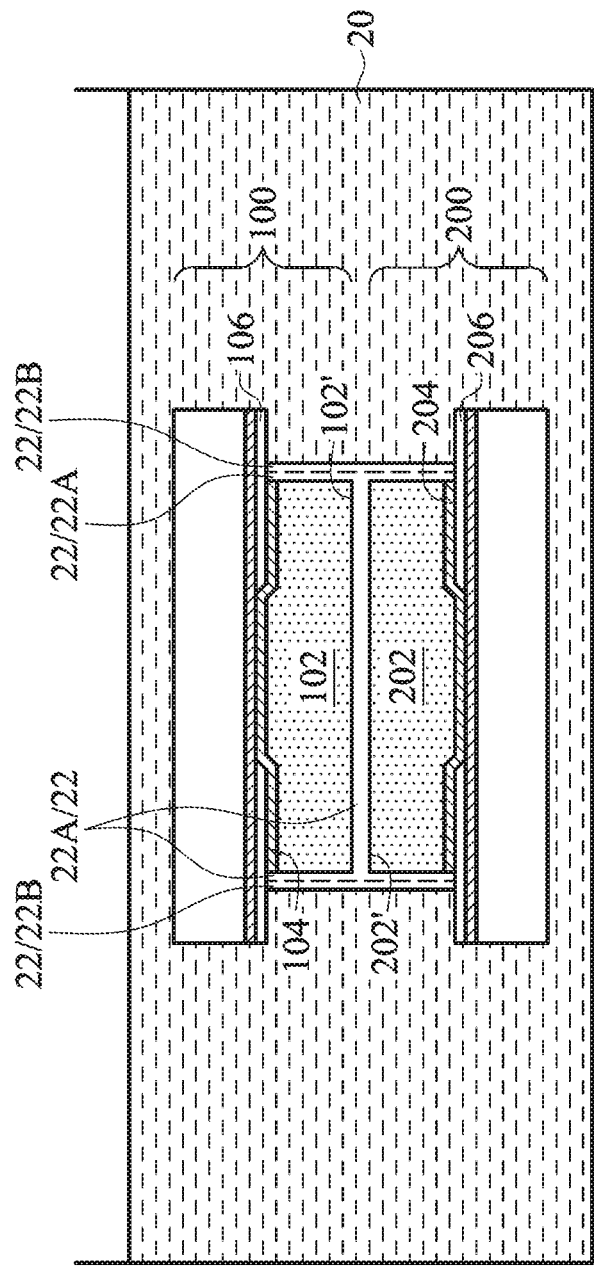

In FIGS. 1 and 2, package components 100 and 200 are bonded with no gap left between electrical connectors 102 and 202. Accordingly, metal layer 22 does not extend between connectors 102 and 202. FIGS. 3 and 4 illustrate the bonding of package components 100 and 200 in accordance with alternative embodiments. Unless specified otherwise, the materials and formation methods of the components in these embodiments and the embodiments in FIGS. 5 through 11 are essentially the same as the components that are denoted in FIGS. 1 and 2 using same reference numerals. The details of the like components shown in FIGS. 3 through 11 may thus be found in the discussion of the embodiments shown in FIGS. 1 and 2.

Referring to FIG. 3, package components 100 and 200 are placed, with electrical connectors 102 and 202 aligned to each other. The relative positions of package components 100 and 200 are fixed and secured, for example, by clamps and spacers (not shown). As a result, electrical connectors 102 and 202 are spaced apart from each other by a gap having a D1 distance. Distance D1 between electrical connectors 102 and 202 may be smaller than about 10 µm, although distance D1 may have a different value. The placement of package components 100 and 200 are performed before package components 100 and 200 are placed into reaction solution 20, wherein the placing of package components 100 and 200 into reaction solution 20 is represented by an arrow in FIG. 3.

Next, as shown in FIG. 4, package components 100 and 200 are placed in reaction solution 20, so that metal layer 22 is plated, wherein the step for plating metal layer 22 is the same as the plating step shown in FIGS. 1 and 2. The resulting metal layer 22 bonds package components 100 and 200 to each other. Metal layer 22, besides being plated on the sidewalls of electrical connectors 102 and 202, also comprises a portion plated between electrical connectors 102 and 202. The portion of metal layer 22 in the gap contacts both surfaces 102' and 202'. In some embodiments, metal layer 22 is a composite layer comprising sub-layers 22A and 22B, which comprise different metals. In some other embodiments, metal layer 22 is a composite layer comprising additional sub-layers. Throughout the description, sub-layer 22A is label using both "22A" and "22" to indicated that sub-layer 22A is also a portion of layer 22, and sub-layer 22B is label using both "22B" and "22" to indicated that sub-layer 22B is also a portion of layer 22. In some other embodiments, metal layer 22 comprises more than two sub-layers. Accordingly, the composite metal layer 22 is plated using a plurality of reaction solutions 20, each for plating one sub-layer. Each of the sub-layers (such as 22A and 22B) is plated using the same method shown in FIGS. 1 and 2, except that the reaction solution is selected according to the metal in the corresponding sub-layers. Sub-layer 22B may be plated when sub-layer 22A has already filled the gap between electrical connectors 102 and 202 substantially fully. In some exemplary embodiments, sub-layer 22A is a nickel layer that is plated between, and on sidewalls of, electrical connectors 102 and 202. Sub-layer 22B is a gold layer, or a composite layer comprising a palladium layer and a gold layer. In alternative embodiment, sub-layer 22A is a composite layer comprising a nickel layer and a palladium layer, and is plated between, and on sidewalls of, electrical connectors 102 and 202. Sub-layer 22B may in turn be a gold layer. After the plating of metal layer 22, package components 100 and 200 are taken out of reaction solution 20, and are rinsed.

Figure 5:
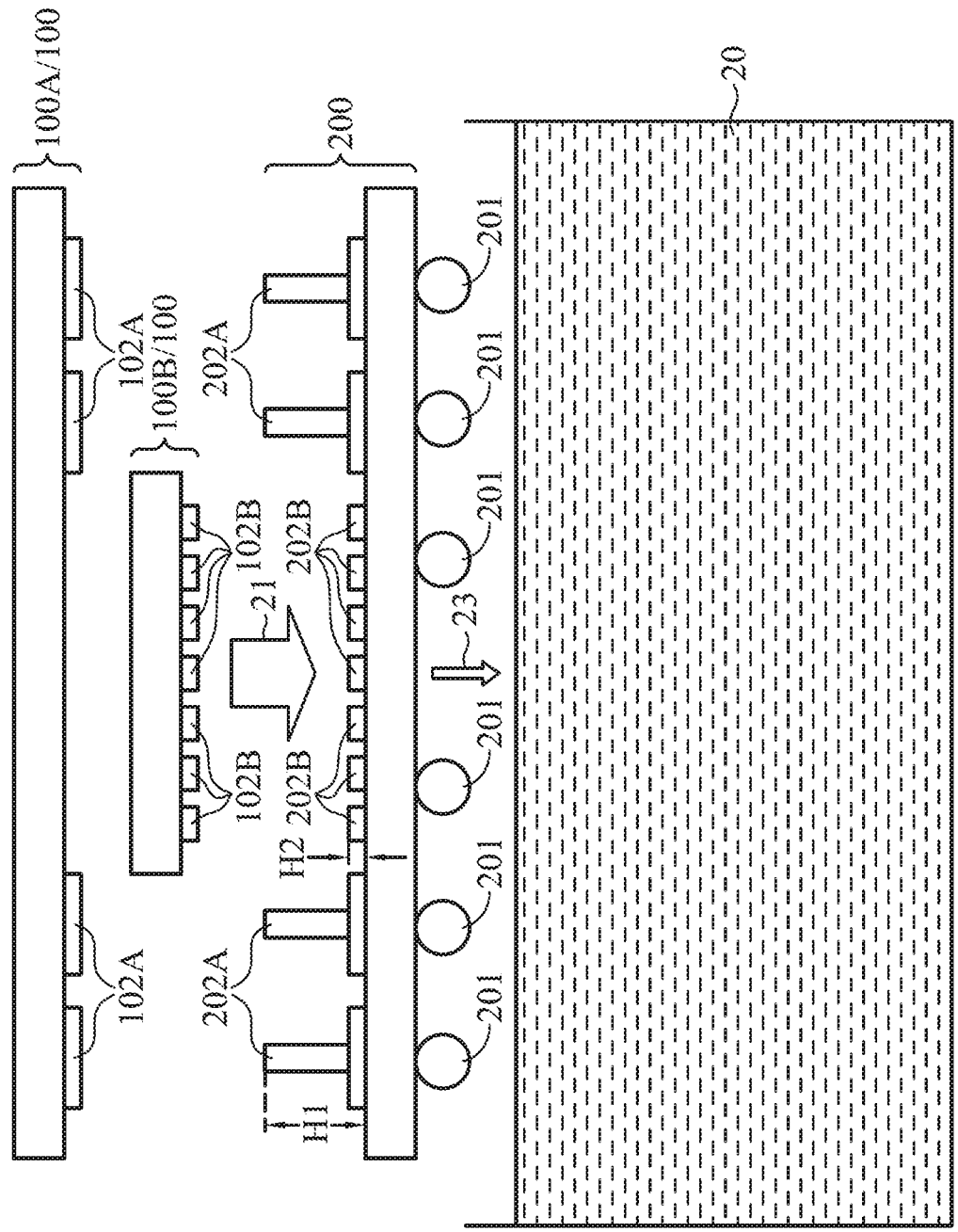
Figure 6:
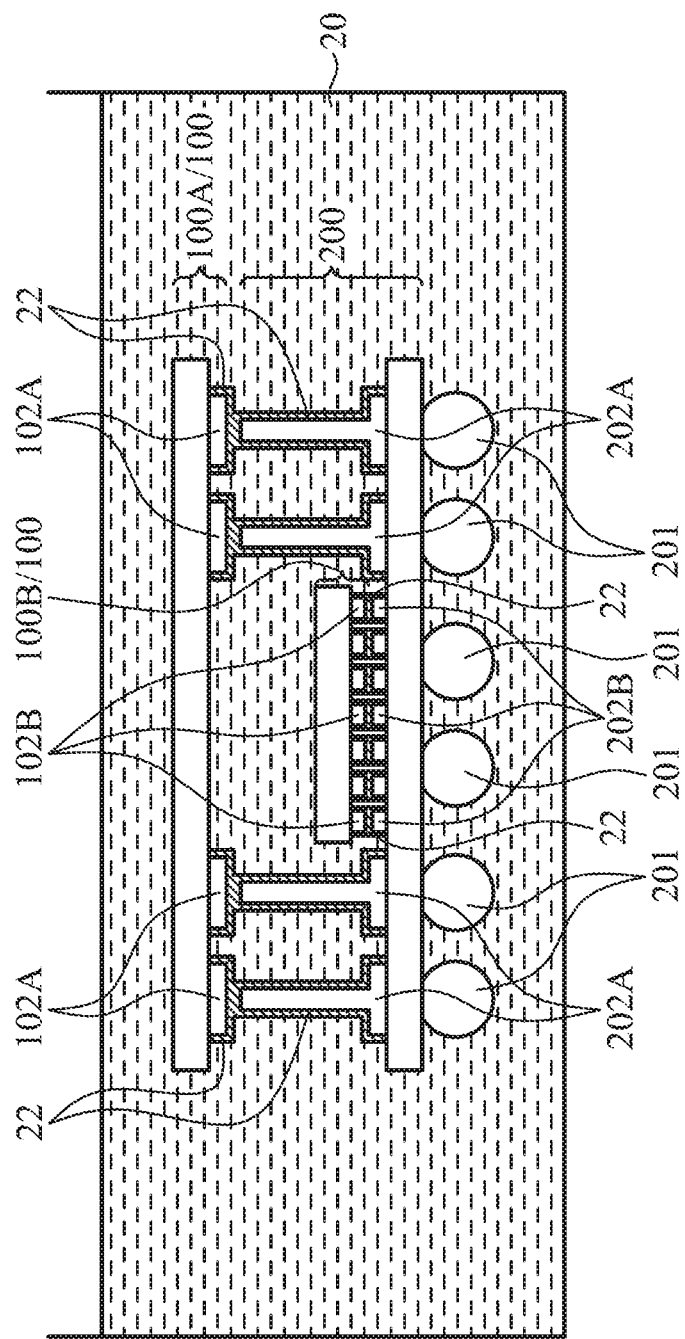

FIGS. 5 and 6 illustrate the intermediate stages in bonding through plating, wherein package components 100 includes two separate package component 100A and 100B. Referring to FIG. 5, package component 200 includes electrical connectors 202, which further include electrical connectors 202A and 202B. Height H1 of electrical connectors 202A is greater than height H2 of electrical connectors 202B. Package component 100A includes electrical connectors 102A, which are aligned to electrical connectors 202A. Package component 100B includes electrical connectors 102B, which are aligned to electrical connectors 202B. Package component 100B may also be a device die, an interposer, a package substrate, a package, or the like.

Next, electrical connectors 102A and 102B are aligned to electrical connectors 202A and 202B, respectively, and the positions of package components 100A, 100B, and 200 are fixed relative to each other. Package component 200 may include electrical connectors 201, which may be solder balls. In some embodiments, similar to FIG. 1, electrical connectors 102A are in contact with electrical connectors 202A, and/or electrical connectors 102B are in contact with electrical connectors 202B. In alternative embodiments, similar to FIG. 3, electrical connectors 102A are spaced apart from electrical connectors 202A, and/or electrical connectors 102B are spaced apart from electrical connectors 202B. Arrow 21 in FIG. 5 represents the step for placing package components 100A, 100B, and 200 together, and arrow 23 represents that package components 100A, 100B, and 200 are placed into reaction solution 20.

Next, as shown in FIG. 6, package components 100A, 100B, and 200 are placed in reaction solution 20 to form metal layers 22. As a result, package components 100A and 100B are bonded to package component 200. In some embodiments, metal layers 22 are not inserted between electrical connectors 102A and 202A (or 102B and 202B), similar to what are shown in FIG. 2. In alternative embodiments, metal layers 22 are inserted between electrical connectors 102A and 202A (or 102B and 202B), similar to what are shown in FIG. 4. The details of metal layer 22 are essentially the same as in FIGS. 2 and 4, and hence are not repeated herein.

In FIG. 6, the bonding of package components 100A and 100B to package component 200 is performed simultaneously. In alternative embodiments, the step of bonding package component 100B to package component 200 is performed before the step of bonding package component 100A to package component 200.

Figure 7:
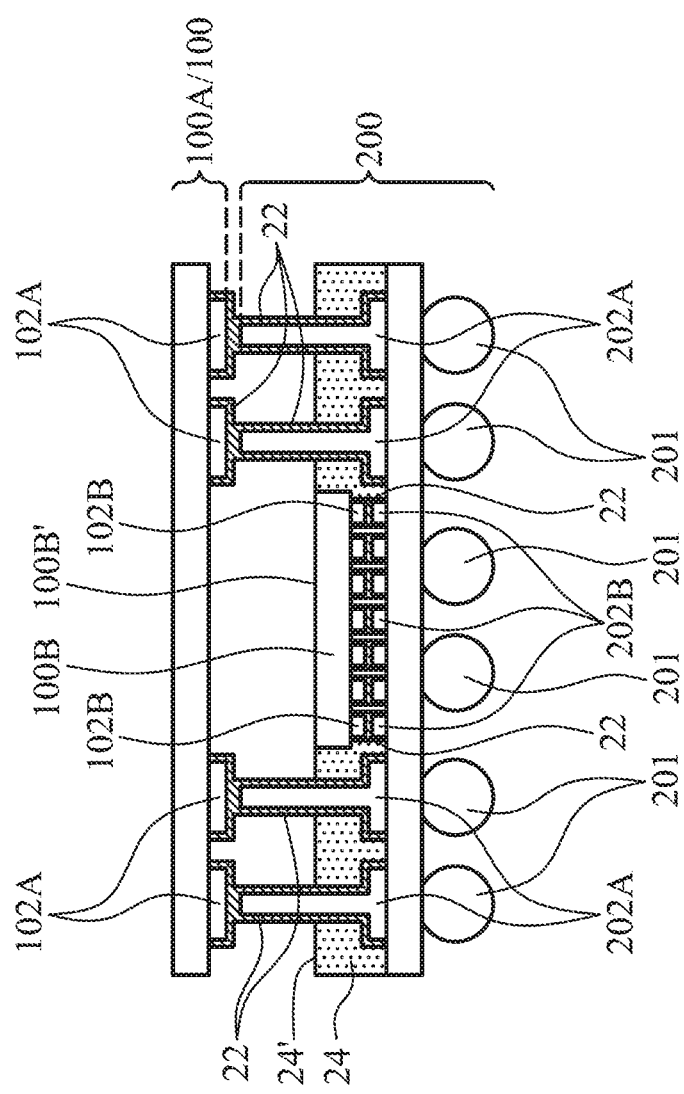
FIGS. 7 through 11 are cross-sectional views of bonded package components in accordance with some alternative exemplary embodiments.
Figure 8:
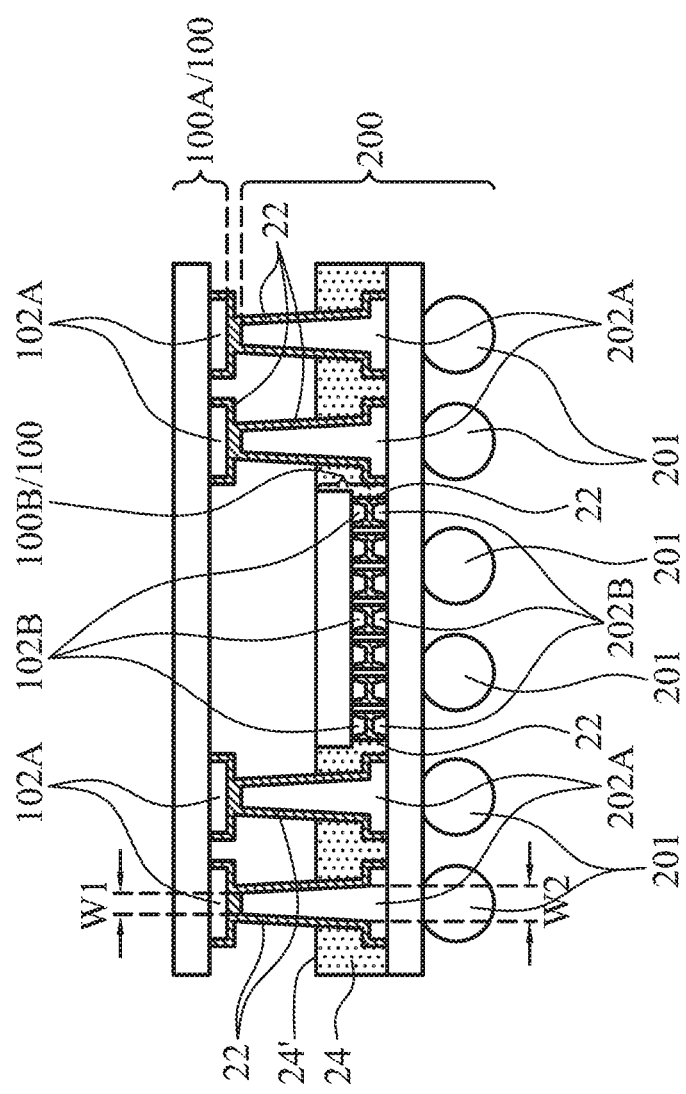

FIG. 7 illustrates a resulting package after the bonded package components 100A, 100B, and 200 are taken out of reaction solution 20 and rinsed. Next, polymer 24, which may be a molding compound, a molding underfill, or the like, is dispensed into the gap between package components 100A and 200. Polymer 24 molds package component 100B therein. In some embodiments, as shown in FIG. 7, polymer 24 has top surface 24' level with or slightly lower than top surface 100B' of package component 100B. In alternative embodiments, polymer 24 fills an entirety of the gap between package components 100A and 200. Package component 100B is hence fully encapsulated in polymer 24.

FIGS. 8 through 11 illustrate the bonded package in accordance with alternative embodiments. These embodiments are essentially the same as the embodiments in FIGS. 5 through 7, except that the shapes of electrical connectors 102A/102B/102/202A/202B/202 are different. For example, in FIG. 8, electrical connectors 102A are bond pads. Electrical connectors 202A are tapered metal pillars, with top width W1 smaller than bottom width W2. The tapered ends of electrical connectors 202A are bonded to bond pads 102A. Electrical connectors 202A are tapered in accordance with these embodiments. The surfaces of electrical connectors 102A and 202A have different sizes.

Figure 9:
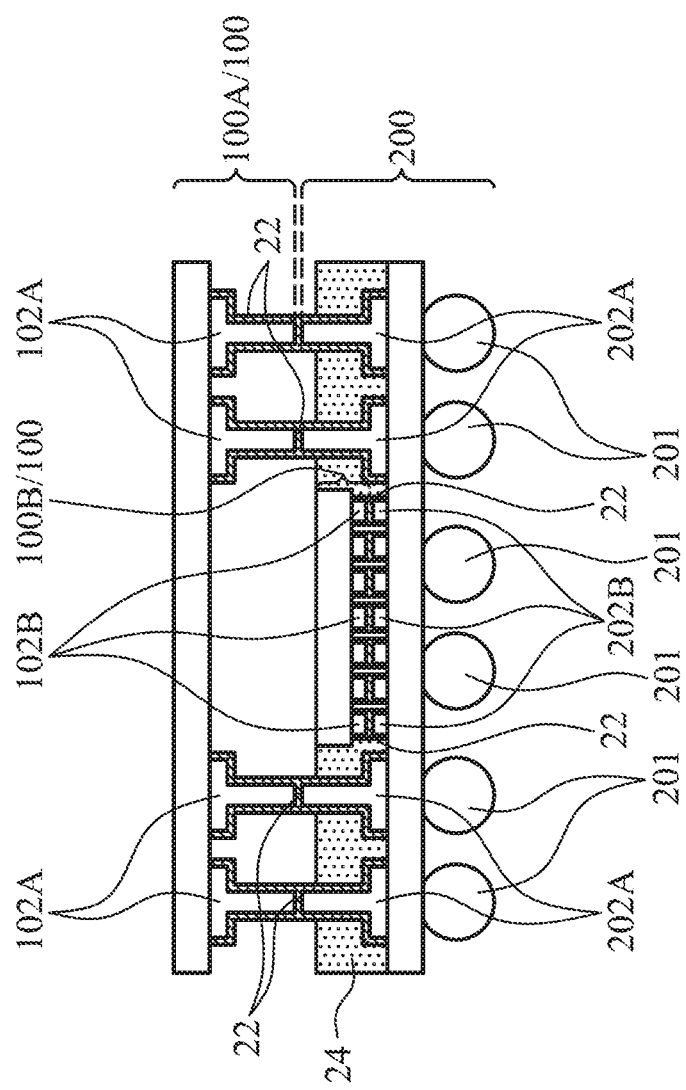
Figure 10:
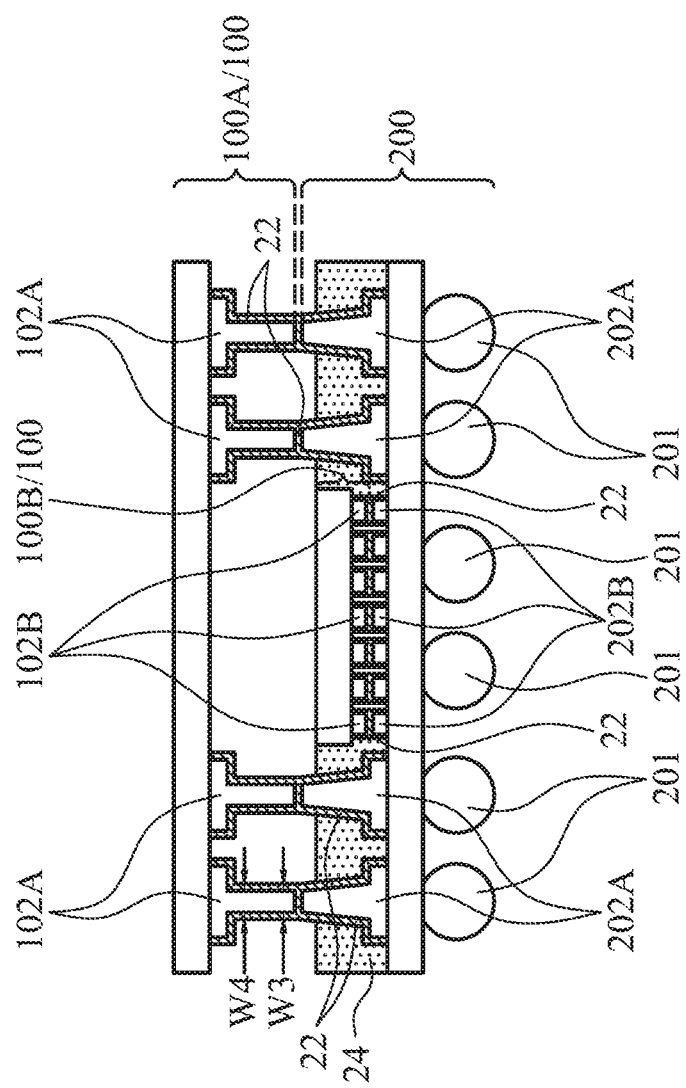
Figure 11:
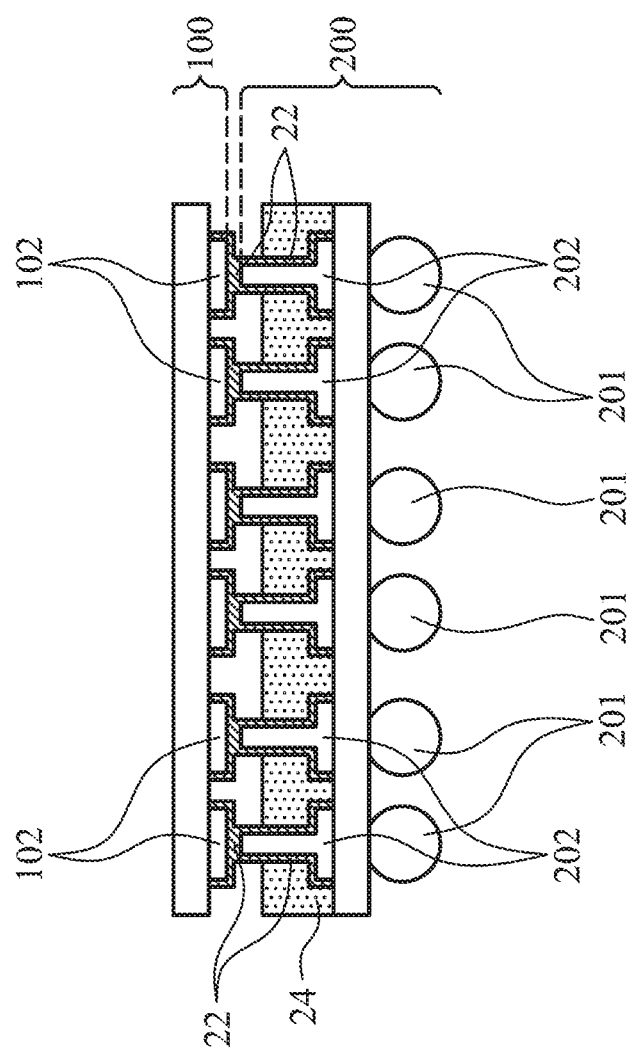

In FIG. 9, electrical connectors 102A and 202A are all metal pillars, and the surfaces of electrical connectors 102A and 202A that contact each other may have substantially equal sizes. In FIG. 10, electrical connectors 102A and 202A are all metal pillars. Metal pillars 102A are not tapered, and width W3 is substantially equal to width W4. Electrical connectors 202A are tapered metal pillars. In FIG. 11, package components 100 and 200 are bonded to each other, with electrical connectors 102 being metal pads, and electrical connectors 202 being metal pillars. No additional package component is disposed between package components 100 and 200 in these embodiments. It is appreciated that FIGS. 8 through 11 show some exemplary combinations of different types and shapes of connectors 102A, 102B, 202A, and 202B, and further combinations of the shapes and types of electrical connectors are also in the scope of various embodiments.

In some embodiments, the bonding process is performed through an electroless plating or an immersion process. Accordingly, compared to existing metal-to-metal direct bonding, the bonding in accordance with embodiments may be performed at lower temperatures, and no high pressure is needed to press the package components against each other during the bonding process. The bonding in accordance with embodiments also does not involve the use of solder, which is likely to cause bridging due to the reflow process. The minimum pitch of the electrical connectors is thus reduced.

In accordance with embodiments, a method includes aligning a first electrical connector of a first package component to a second electrical connector of a second package component. With the first electrical connector aligned to the second electrical connector, a metal layer is plated on the first and the second electrical connectors. The metal layer bonds the first electrical connector to the second electrical connector.

In accordance with other embodiments, a method includes aligning a first electrical connector of a first package component to a second electrical connector of a second package component. With the first electrical connector aligned to the second electrical connector, the first and the second package components are submerged into a plating solution to plate a metal layer, wherein the metal layer is in contact with the first and the second electrical connectors, and bonds the first electrical connector to the second electrical connector. After the metal layer is plated, the first package component and the second package component are retrieved from the plating solution.

In accordance with yet other embodiments, a device includes a first package component having a first electrical connector, wherein the first electrical connector comprises a first surface and first sidewall surfaces. The device further includes a second package component having a second electrical connector, wherein the second electrical connector comprises a second surface and second sidewall surfaces, and wherein the second surface of the second electrical connector faces the first surface of the first electrical connector. A metal layer includes a first portion on the first sidewall surfaces and a second portion on the second sidewall surfaces, wherein the first portion is continuously connected to the second portion, with no interfaces therebetween.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first package component comprising a first electrical connector, wherein the first electrical connector comprises a first planar surface;
    forming a second package component comprising a second electrical connector, wherein the second electrical connector comprises a second planar surface;
    securing the first package component to be close to the second package component, wherein the first planar surface is parallel to, and is spaced apart from, the second planar surface; and
    with the first package component secured to be parallel to the second package component, plating a metal layer, wherein the metal layer joins the first package component to the second package component, and the metal layer contacts the first planar surface, the second planar surface, and sidewalls of each of the first electrical connector and the second electrical connector.

2. The method of claim 1, wherein a portion of the metal layer extends between the first electrical connector and the second electrical connector, and the portion comprises a first surface contacting the first planar surface, and a second surface contacting the second planar surface, and the first surface and the second surface are opposing to each other.

3. The method of claim 2, wherein the first surface and the second surface of the portion of the metal layer are parallel to each other.

4. The method of claim 1, wherein the plating the metal layer comprises plating a first sub-layer, and plating a second sub-layer on the first sub-layer, and wherein the first sub-layer and the second sub-layer comprise different materials.

5. The method of claim 4, wherein the second sub-layer does not extend between the first electrical connector and the second electrical connector.

6. The method of claim 4, wherein the second sub-layer is plated after the first sub-layer fully fills a gap between the first planar surface and the second planar surface.

7. The method of claim 4, wherein the first sub-layer extends on sidewalls of both of the first electrical connector and the second electrical connector.

8. The method of claim 1, wherein the plating is performed in a reaction solution.

9. The method of claim 1 further comprising applying a polymer to cover the second package component.

10. A method comprising:
    forming a first package component comprising a first metal pillar, wherein the first metal pillar comprises:
        first sidewall surfaces;
        a first surface joining to the first sidewall surfaces;
    forming a second package component comprising a second metal pillar, wherein the second metal pillar comprises:
        second sidewall surfaces;
        a second surface joining to the second sidewall surfaces;
    putting the first surface parallel to, and spaced apart from, the second surface; and
    plating an integral metal layer extending on and contacting both of the first surface and the second surface and both of the first sidewall surfaces and the second sidewall surfaces.

11. The method of claim 10, wherein one of the first sidewall surfaces and one of the second sidewall surfaces form a straight surface in a cross-sectional view of the first package component and the second package component.

12. The method of claim 10, wherein the first metal pillar is wider than the second metal pillar.

13. The method of claim 10, wherein the plating the integral metal layer comprises a plurality of plating processes using different plating solutions.

14. The method of claim 10, wherein both of the first surface and the second surface are planar surfaces that are perpendicular to the first sidewall surfaces and the second sidewall surfaces.

15. The method of claim 10, wherein both of the first surface and the second surface are planar surfaces, and during the plating, the first surface and the second surface are spaced apart from each other by a distance, and wherein the distance remains unchanged throughout the plating.

16. A method comprising:
    forming a first package component comprising a first electrical connector;
    forming a second package component comprising a second electrical connector;
    performing a first plating process to form a first metal layer extending on both of the first electrical connector and the second electrical connector; and
    performing a second plating process to form a second metal layer on the first metal layer, wherein the first plating process and the second plating process are performed in different plating solutions.

17. The method of claim 16, wherein the second metal layer is fully separated from both of the first electrical connector and the second electrical connector by the first metal layer.

18. The method of claim 16, wherein the second metal layer is free from portions between the first electrical connector and the second electrical connector.

19. The method of claim 16, wherein one of the first metal layer and the second metal layer is plated through an electroless plating process.

20. The method of claim 16, wherein the first metal layer and the second metal layer comprise different metals.

* * * * *